US012785683B2

(12) United States Patent
Ansari et al.

(10) Patent No.: US 12,785,683 B2
(45) Date of Patent: Nov. 3, 2026

(54) METHOD FOR OPERATING A CIRCUIT HAVING A FIRST AND A SECOND QUBIT

(71) Applicant: Forschungszentrum Jülich GmbH, Jülich (DE)

(72) Inventors: Mohammed Ansari, Aachen (DE); Xuexin Xu, Jülich (DE)

(73) Assignee: Forschungszentrum Jülich GmbH, Jülich (DE)

( * ) Notice: Subject to any disclaimer, the term of this patent is extended or adjusted under 35 U.S.C. 154(b) by 939 days.

(21) Appl. No.: 18/041,148

(22) PCT Filed: Aug. 24, 2021

(86) PCT No.: PCT/EP2021/073339
§ 371 (c)(1),
(2) Date: Feb. 9, 2023

(87) PCT Pub. No.: WO2022/043297
PCT Pub. Date: Mar. 3, 2022

(65) Prior Publication Data

US 2023/0318600 A1 Oct. 5, 2023

(30) Foreign Application Priority Data

Aug. 26, 2020 (DE) ..................... 10 2020 005 218.5
Aug. 26, 2020 (DE) ..................... 10 2020 122 245.9

(51) Int. Cl.
*H03K 17/92* (2006.01)
*G06N 10/40* (2022.01)

(52) U.S. Cl.
CPC ............ *H03K 17/92* (2013.01); *G06N 10/40* (2022.01)

(58) Field of Classification Search
CPC ..................................................... H03K 17/92
See application file for complete search history.

(56) References Cited

U.S. PATENT DOCUMENTS 11,411,159 B1 * 8/2022 White .................... H10N 69/00
2018/0225586 A1 8/2018 Chow et al.
(Continued)

FOREIGN PATENT DOCUMENTS

WO 2014140943 A1 9/2014

OTHER PUBLICATIONS

Provisional U.S. Appl. No. 63/039,927 (Year: 2021).*
(Continued)

*Primary Examiner* — Paul A Wartalowicz
(74) *Attorney, Agent, or Firm* — Jacob M. Ward; Ward Law Office LLC

(57) ABSTRACT

The invention relates to a method for operating a circuit with a first qubit (7) and a second qubit (3), wherein the circuit is configured such that the frequency of the first qubit (7) is different from the frequency of the second qubit (3), with a coupler (4) coupling the first qubit (7) and the second qubit (3), wherein a cross-resonance pulse is sent to the first qubit (7), wherein the amplitude of the cross-resonance pulse is selected such that the two-qubit phase error is minimal or at least substantially minimal in absolute values. The two-qubit phase error is determined by measuring the qubit Hamiltonian and measuring the coupling strength of the ZZ interaction in kilohertz precision. The invention can achieve high two-qubit gate fidelity.

7 Claims, 6 Drawing Sheets

(56) References Cited

U.S. PATENT DOCUMENTS

| | | | | |
|---|---|---|---|---|
| 2021/0099201 | A1* | 4/2021 | Winick | G06N 10/20 |
| 2021/0305480 | A1* | 9/2021 | Holmes | G01R 33/0358 |

OTHER PUBLICATIONS

Provisional U.S. Appl. No. 62/941,230 (Year: 2019).*

Ku Jaseung et al, "Suppression of Unwanted ZZ Interactions in a Hybrid Two-Qubit System", Apr. 9, 2020, 21 pages, https://arxiv.org/pdf/2003.02775.pdf.

Neereja Sundaresan et al, "Reducing unitary and spectator errors in cross resonance with optimized rotary echoes", Cornell University Library, Jul. 6, 2020, 22 pages, https://arxiv.org/pdf/2007.02925.pdf.

Xuexin Xu et al, "ZZ freedom in two qubit gates", Cornell University Library, Sep. 1, 2020, 13 pages, https://arxiv.org/pdf/2009.00485.pdf.

Zhao Peng et al, "Interaction Using Superconducting Qubits with Opposite-Sign Anharmonicity", Aug. 20, 2020, 6 pages, https://arxiv.org/pdf/2002.07560v3.pdf.

Malekakhlagh, Moein; McKay, David C. First-principles analysis of cross-resonance gate operation, arXiv preprint Version 2 arXiv:2005.00133v2; May 5, 2020. URL: https://arxiv.org/abs/2005.00133v2 [retrieved on May 11, 2021].

English Translation of the Written Opinion of the International Searching Authority for PCT/EP2021/073339 dated Dec. 3, 2021, 7 pages.

* cited by examiner

| Frequency of the first qubit in GHz | Anharmonicity of the first qubit in GHz | Frequency of the second qubit in GHz | Anharmonicity of the first qubit in GHz | Frequency of the bus resonator (coupler) in GHz | Direct qubit-qubit coupling in MHz | Coupler coupling in MHz of the first qubit | Coupler coupling in MHz of the second qubit | Could E11-E01-E10+E00 = 0 be found? |
|---|---|---|---|---|---|---|---|---|
| 5.22 | +0.6 | 5.29 | -0.33 | 6.39 | 0 | 80 | 80 | yes |
| 5.22 | +0.6 | 5.29 | -0.33 | 6.49 | 0 | 80 | 80 | yes |
| 5.185 | +0.6 | 5.29 | -0.33 | 6.49 | 0 | 80 | 80 | yes |
| 5.14 | +0.6 | 5.29 | -0.33 | 6.49 | 0 | 80 | 80 | no |
| 5.11 | +0.6 | 5.29 | -0.33 | 6.49 | 0 | 80 | 80 | no |
| 5.11 | -0.33 | 4.91 | -0.33 | 6.31 | 2.5 | 98 | 83 | no |
| 5.06 | -0.33 | 4.91 | -0.33 | 6.31 | 2.5 | 98 | 83 | no |
| 5.01 | -0.33 | 4.91 | -0.33 | 6.31 | 2.5 | 98 | 83 | yes |
| 4.96 | -0.33 | 4.91 | -0.33 | 6.31 | 2.5 | 98 | 83 | yes |
| 4.98 | -0.33 | 4.91 | -0.33 | 6.91 | 2.5 | 98 | 83 | yes |

FIG. 5

| CNOT Gate | Result state in qubits with two-qubit phase error ($\gamma \neq 0$) | Result state in qubits with two-qubit phase error ($\gamma = 0$) |
|---|---|---|
| Applying CNOT for the time t on $\|00\rangle$ | $e^{+i\gamma t}\|00\rangle$ | $\|00\rangle$ |
| Applying CNOT for the time t on $\|01\rangle$ | $e^{-i\gamma t}\|01\rangle$ | $\|01\rangle$ |
| Applying CNOT for the time t on $\|10\rangle$ | $e^{-i\gamma t}\|11\rangle$ | $\|11\rangle$ |
| Applying CNOT for the time t on $\|11\rangle$ | $e^{+i\gamma t}\|10\rangle$ | $\|10\rangle$ |
| Idle qubits | Result state in qubits with two-qubit phase error ($g \neq 0$) | Result state in qubits with two-qubit phase error ($g = 0$) |
| Idle for time t $\|00\rangle$ | $e^{+igt}\|00\rangle$ | $\|00\rangle$ |
| Idle for time t $\|01\rangle$ | $e^{-igt}\|01\rangle$ | $\|01\rangle$ |
| Idle for time t $\|10\rangle$ | $e^{-igt}\|11\rangle$ | $\|11\rangle$ |
| Idle for time t $\|11\rangle$ | $e^{+igt}\|10\rangle$ | $\|10\rangle$ |

FIG. 6

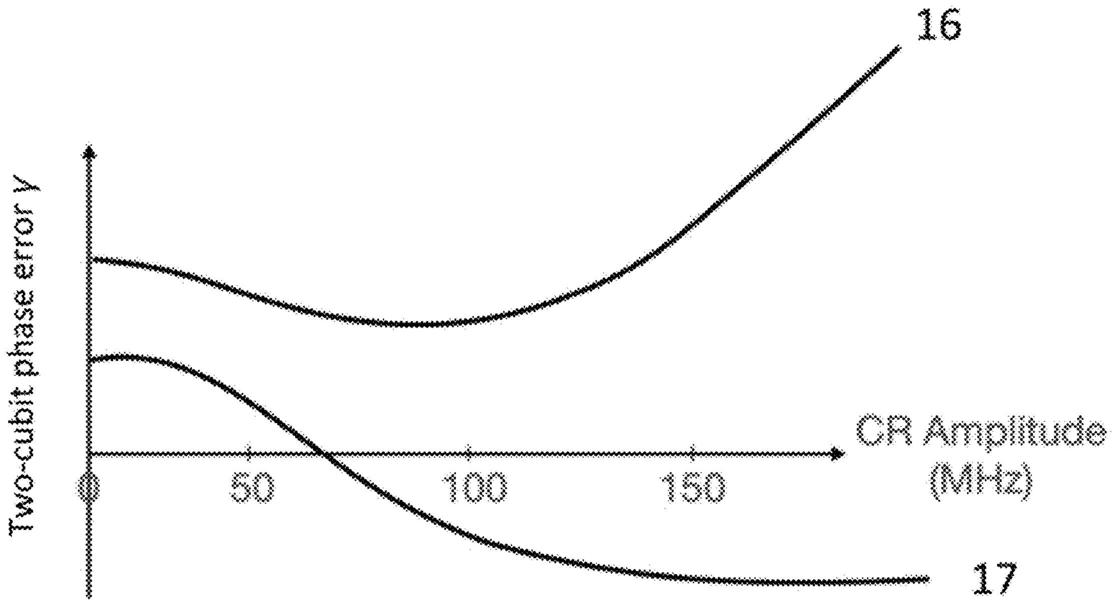

FIG. 7

METHOD FOR OPERATING A CIRCUIT HAVING A FIRST AND A SECOND QUBIT

BACKGROUND OF THE INVENTION

Field of the Invention. The invention relates to a method for operating a circuit with a first and a second qubit, and with a coupler that couples the first qubit to the second qubit.

Description of Related Art. A classical computer can store and process data in the form of bits. Instead of bits, a quantum computer stores and processes quantum bits, also called qubits.

Like a bit, a qubit can have two different states. The two different states can be two different energy eigenvalues, which can represent a 0 and a 1 as in the classical computer. The ground state, i.e., the lowest energy level, can be represented by 0. The notation I0> can be used for this. For the 1, the state with the next higher energy can be provided, which may be expressed by the notation I1>. In addition to these two ground states I0> and I1>, a qubit can occupy the states I0> and I1> simultaneously. Such a superposition of the two states I0> and I1> is called superposition. This can be described mathematically by Iψ>=c0 I0>+c1 I1>. A superposition can only be maintained for a very short time. Therefore, there is very little time available for computational operations exploiting superposition. Physical qubits produced in the laboratory will not only have these two states 0 and 1, also called computational states, they will also have higher excitation levels, denoted by I2>, I3>, I4> . . . . The higher excitation levels are also called non-computation states.

Qubits of a quantum computer can be independent of each other. However, qubits can also be dependent on each other. The dependent state is called entanglement.

Several qubits are combined in a quantum computer to form a quantum register. For a register consisting of two qubits, there are then the base states I00>, I01>, I10>, I11>. The state of the register can be any superposition of the base states of a register. Two qubits define a computation state I00>, I01>, I10>, I11>. The number of computation states for n qubits is 2 to the power of n, i.e., 2n. Two qubits define non-computation states, such as I02>, I03>, . . . , I20>, I30>, . . . , I12>, I13>, I22>, I31>, . . . . The number of non-computation states can be large and even infinite.

A circuit with two qubits comprises energy levels. If the two qubits are in the state |n1,n2>, the corresponding energy level is En1n2. n1 and n2 are the states of the first qubit and the second qubit, respectively. Thus, E11 is the energy level of the circuit when the state |1, 1> is present, i.e., both qubits are in the state |1>. For a qubit, the energy difference between state 0 and 1 is called the qubit frequency ω=(E1−E0)/h, where h is Planck's constant. The energy spectrum of a qubit is not equidistant (uniformly distributed). Therefore, the energy spectrum of a qubit is not similar to that of a harmonic oscillator. The qubit anharmonicity is defined as δ=(E2−2E1−E0)/h.

In the case of the non-interacting qubits 1 and 2, the energy levels of the computation states are the lowest four levels, and all of the non-computation states have energies greater than E11. In the case of interacting qubits 1 and 2, some of the non-computation states may find energies below E11. This depends on the strength of the interaction between the qubits and also on the qubit frequencies and anharmonicities.

In a quantum computer, there are both entangled qubits and qubits that are independent of each other. Ideally, independent qubits do not influence each other. The independent qubits are called idle qubits. In the absence of a gate, superconducting idle qubits accumulate errors in the phase of two qubit states. When the state of two qubits is the same, both 0 or both 1, they accumulate a positive phase. If the states of two qubits are different, they accumulate a negative phase. This means that the idle state |00> changes to exp(+i g·t) |00> after time t in the absence of a gate. Similarly, the state |11> changes to exp(+i g·t)|11>. The state |01> evolves to exp(−i g·t) |01>. The state |10> evolves to exp(−i g·t) |10>.

Two superconducting qubit gates are always accompanied by a degrading effect of an unwanted ZZ-type interaction. In the absence of the gate, this ZZ interaction appears with a coupling strength proportional to g. This is the same coefficient that causes a two-qubit-state phase error.

If an action is applied to a quantum register in the course of time, this is called a quantum gate or gate. Thus, a quantum gate acts on a quantum register and thereby changes the state of a quantum register. A quantum gate essential for quantum computers is the CNOT gate. If a quantum register consists of two qubits, a first qubit acts as a control qubit and the second acts as a target qubit. The CNOT gate causes the ground state of the target qubit to change when the ground state of the control qubit is I1>. The ground state of the target qubit does not change if the ground state of the control qubit is I0>.

The CNOT gate is an example of a two-qubit gate applied to entangle two interacting qubits. Applying CNOT to a two-qubit state where the first qubit is |0> results in the same state. Applying CNOT to the first qubit in the |1> state results in a state reversal, wherein in the second qubit |0> is changed to |1> or |1> is changed to |0>.

Applying CNOT to qubits that have higher excitation levels above the 0 and 1 states not only results in a two-qubit phase error for the final state. This suggests that during the time CNOT was applied, the state accumulated a phase due to an unwanted ZZ interaction between qubits.

The presence of two-qubit phase errors between the first and second qubits and their crosstalk is one of the main problems of quantum computers. In superconducting qubits, such unwanted entanglements consist due to the presence of higher excitation energies in each qubit. Superconducting qubits, such as transmons, undesirably exchange information and energy across non-computation states and energy levels. One such interaction between computation states and non-computation states is a ZZ interaction. The ZZ interaction is always present, independently of whether any gate is applied to qubits or not. The ZZ interaction in the absence of a gate is called a static ZZ interaction. The coupling strength of the static ZZ interaction g is equivalent to the following energy difference: E11−E01−E10+E00. This absolute value corresponds to the level repulsion in computational states from their interaction with non-computation states. The level repulsion is also called avoided superposition. The static repulsion is always present and causes qubits to accumulate erratic phases at rest.

When a microwave is applied to one of two qubits, all energy levels En1n2 of the two qubits change, some decrease and some increase. This leads to the desired two-qubit gate, such as CNOT.

Applying microwave two-qubit gates changes the repulsion levels of non-computation-based energy levels. The gate changes the magnitude of the phase error from exp(±i g·t) in free qubits to γ exp(±i γ·t) in the presence of a microwave pulse. The magnitude of the phase error can increase or decrease. By eliminating the level repulsion, γ=0 is set, and this removes the phase error exp(±i γ·t) by setting it to 1. This process of producing a "two-qubit state free of phase errors" is an object of the present invention.

The publication WO2014/140943A1 discloses a device with at least two qubits. A bus resonator is coupled to the two qubits. A transmon and a CSFQ (capacitively shunted flux qubit) are mentioned as examples of qubits. The publications WO 2013/126120 A1 as well as WO 2018/177577 A1 disclose a transmon or a CSFQ as examples of qubits. The publication "Engineering Cross Resonance Interaction in Multi-modal Quantum Circuits, Sumeru Hazra et al., arXiv: 1912.10953v1 [quant-ph] 23 Dec. 2019", discloses a tuning of cross resonance interactions for a multi-qubit gate. Cross-resonance pulses are known from this publication. The publication US 2014264285 A discloses a quantum computer with at least two qubits and a resonator. The resonator is coupled to the two qubits. A microwave drive is provided. A 2-qubit phase interaction can be activated by a tuned microwave signal applied to a qubit. The publication US 2018/0225586 A1 discloses a system comprising a superconducting control qubit and a superconducting target qubit.

The publication "Suppression of Unwanted ZZ Interactions in a Hybrid Two-Qubit System, Jaseung Ku, Xuexin Xu, Markus Brink, David C. McKay, Jared B. Hertzberg, Mohammad H. Ansari, and B. L. T. Plourde, arXiv: 2003.02775v2 [quant-ph] 9 Apr. 2020" discloses suppression of unwanted ZZ interactions by means of a circuit comprising two qubits. The first qubit is a qubit with a negative anharmonic energy spectrum. The second qubit is a qubit with a positive anharmonic energy spectrum. This publication shows circuit characteristics for setting the idle two-qubit phase error to zero, i.e., g=0.

BRIEF SUMMARY OF THE INVENTION

It is a task of the invention to improve the two-qubit gate fidelity. The two-qubit gate fidelity determines the extent to which the final state of two qubits after applying a real gate is similar to the final state after applying an ideal gate. In this invention, we eliminate the two-qubit phase error from a two-qubit gate and improve the gate fidelity.

The task of the invention is solved by a method having the features of the first claim. Advantageous embodiments result from the dependent claims.

To solve the problem, a circuit comprises a first qubit and a second qubit. The frequency of the first qubit is different from the frequency of the second qubit. The anharmonicity of the two qubits can have the same or opposite sign. There is a coupler that couples the first qubit and the second qubit. There is at least one microwave generator that can be used to generate microwaves. The microwave generator is coupled to the first qubit such that microwave pulses can be sent to the first qubit. A first cross-resonance pulse is sent to the first qubit. The amplitude of the first cross-resonance pulse is set such that the absolute value of the two-qubit phase error that arises after application of a cross-resonance pulse for the duration of t becomes substantially smaller. Preferably, the CR-induced two-qubit-state phase error becomes exactly zero for the duration t during which the cross-resonance pulse is applied.

How to select the amplitude of the cross-resonance pulse can be theoretically determined, for example by the circuit QED theory. In order to determine experimentally whether the repulsion of the CR-induced level of non-computation states is zero or at least close to zero, a modified version of the quantum Hamiltonian tomography method can be used. The standard quantum Hamiltonian tomography method can be found in the publication Sarah Sheldon, Easwar Magesan, Jerry M. Chow, and Jay M. Gambetta, "Procedure for systematic tuning up known cross-talk in the cross-resonance gate," PHYSICAL REVIEW A 93, 060302 (R) (2016). Modified quantum Hamilton tomography replaces the echo-like cross-resonance pulse with a cross-resonance pulse.

In order for the frequencies of the two qubits to differ, they can be built differently. Alternatively or complementarily, a magnetic field can be used to change the frequency of a qubit to arrive at a circuit with two qubits whose frequencies are different.

The first qubit to which the cross-resonance pulse is sent is called the control qubit. The other qubit is called target qubit.

The first and second qubits may be superconducting qubits. The first qubit can be a transmon. The first qubit can be a CSFQ. The second qubit can be a transmon. The second qubit can be a CSFQ.

In one embodiment of the invention, both qubits are a transmon. The qubit with the larger frequency is selected as the control qubit. After applying a cross resonance with certain amplitude, the two-qubit-state phase error is reduced. This increases the CR gate fidelity. By CR gate is meant the cross-resonance gate.

In one embodiment of the invention, the control qubit is a CSFQ. The target qubit is a transmon. The circuit is constructed such that the frequency of the transmon is greater than the frequency of the CSFQ. The application of cross resonance at a certain amplitude can improve the CR gate fidelity.

Preferably, a control device for a qubit is provided by which a qubit can be tuned. Through the control device the frequency and the anharmonicity of the qubit can be changed. By being able to change the frequency of a qubit, a difference between the frequency and the anharmonicity of the first qubit and the frequency of the second qubit can be optimized if necessary. Such optimization can improve the fidelity in an improved manner.

In one embodiment of the invention, a readout pulse is sent to the target qubit after the CR pulse has been applied to the control qubit for the duration of time t. The frequency of the readout pulse is preferably selected so that the measured reflected pulse is minimal. The amplitude or power of the readout pulse is preferably chosen so that the number of photons in the resonator, i.e. in the corresponding electrical conductor, is on average less than 1. The resonator is an example of a coupler. It is a transmission line with a length equal to its natural frequency and consists of a superconductor that capacitively couples qubits. The number of photons in the resonator is proportional to the power of the readout pulse and the frequency. In practice, to ensure that the average number of photons is less than 1, i.e., in the single photon range, the reflection can be measured as a function of frequency at different microwave powers. As a result, the resonant frequency at high power, commonly referred to as the frequency of the bare resonator, shifts to the lowest frequency and finally to the lowest resonant frequency as the microwave power (and hence the number of photons) decreases in average power, when the system enters the so-called "dressed state". At a "knee" just before reaching the dressed state, the number of photons is typically on the order of 1. In practice, the microwave power is set lower preferably from this knee to ensure that one is truly in a one-photon region. For example, the microwave power may be set 10 dB to 30 dB lower, for example 20 dB. By means of the readout pulse, a state of the target qubit can be measured.

According to the invention, by tuning the qubit parameters and the capacitive coupling between the qubit and the coupler and between two qubits and the amplitude of the CR microwaves on the control qubit, the unwanted two-qubit phase error due to the ZZ level repulsion can be suppressed and thus the CR gate fidelity can be improved.

The qubits in the circuit may have equal anharmonicity signs. It is not necessary that the qubits in a circuit have equal anharmonicity signs. The anharmonicity of qubits in a circuit can also be of opposite sign. Thus, one qubit of a circuit may be a transmon that has a negative anharmonicity and another qubit may be a qubit of opposite sign such as a CSFQ qubit. One qubit of a circuit may be a transmon and another qubit may be a further transmon. One qubit of the circuit may be a CSFQ and another qubit may be another CSFQ.

An arbitrary single-qubit gate is achieved by rotation in the Bloch sphere. The rotations between the different energy levels of a single qubit are induced by microwave pulses. Microwave pulses can be sent by a microwave generator to an antenna or to a transmission line coupled to the qubit. The frequency of the microwave pulses may be a resonant frequency with respect to the energy difference between two energy levels of a qubit. Individual qubits can be addressed by a dedicated transmission line or by a common line when the other qubits are not resonant. The axis of rotation can be set by quadrature amplitude modulation of the microwave pulse. The pulse length determines the rotation angle.

The microwave through which two qubits are entangled is the cross-resonance gate. This cross-resonance gate, also called CR gate, is used to entangle qubits in a desired manner. The CR gate generates the desired ZX interaction, which is used to generate CNOT. If instead of a single CR pulse, a sequence of 4 pulses called "Echo-CR" is applied to the control qubit, some of the unwanted interactions such as the X and Y rotation of the target qubit can be eliminated. Echo-CR retains the desired interaction ZX and also cannot eliminate the two-qubit phase error that results from the ZZ repulsive interaction.

The inventors have found that it is possible to eliminate unwanted phase errors in the two-qubit state in a circuit with two qubits, each of which interacts with a coupler and one of which is driven by a cross-resonance pulse, by tuning the parameters of the qubits and the coupling strength between the qubit and coupler, as well as the amplitude of a cross-resonance pulse. Anharmonicities of qubits can have the same sign and anharmonicities of qubits can have the opposite sign.

BRIEF DESCRIPTION OF THE SEVERAL VIEWS OF THE DRAWINGS

The invention is explained in more detail below with reference to figures. The figures show:

FIG. 5: Table;

FIG. 6: Table;

FIG. 7: Graph.

DETAILED DESCRIPTION OF THE INVENTION

Figure 1:
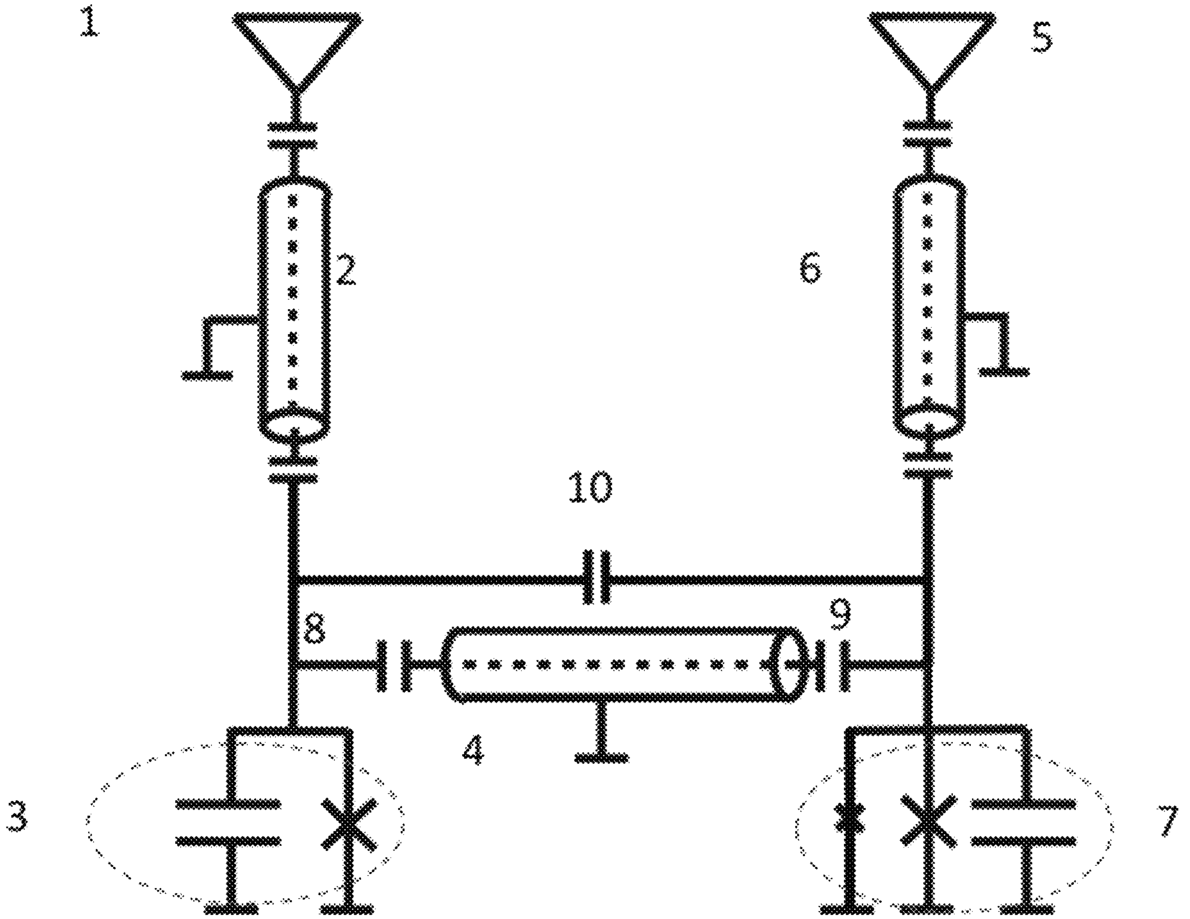
FIG. 1: Circuit.

FIG. 1 illustrates the basic structure with a first qubit 3, a second qubit 7 and a coupler 4 for indirect coupling of the two qubits 3 and 7 via the two coupling capacitors 8 and 9. The qubits 3 and 7 are also directly coupled via the capacitor 10. A first microwave transmission line 2 is coupled to the first qubit 3. A second microwave transmission line 6 is coupled to the second qubit 7. A first microwave port 1 is coupled to the first microwave transmission line 2. A second microwave port 5 is coupled to the second microwave transmission line 6.

The first qubit 3 may be provided as a target qubit. The second qubit 7 may be provided as a control qubit. A qubit 3, 7 may comprise superconducting traces. A qubit 3, 7 may comprise one or more Josephson contacts. The control qubit 7 may be a frequency tunable transmon. The control qubit 7 may also be a frequency tunable CSFQ. In FIG. 1, we present an example circuit where the control qubit 7 is a frequency tunable transmon with two asymmetric Josephson contacts and the target qubit 3 is the example of a fixed frequency transmon with one Josephson contact.

The coupler 4 may be a bus resonator. The coupler 4 may be a superconductor coupled to both qubits 3 and 7 via a capacitance 8 and 9, respectively. The first and second microwave ports 2 and 6 may be a superconductor which may be coupled via capacitances to the associated qubits 3 and 7, respectively, and to the associated transmission line ports 1 and 5, respectively.

Through the coupler 4 there is an indirect coupling between the two qubits 3 and 7.

Advantageously, the frequency of the first or the second qubit 3 or 7 can be tuned. The frequency of the control qubit can be set in the case of FIG. 1. For example, the tunable qubit can be tuned by a magnetic field penetrating the loop of two transitions in the asymmetric transmon. In this case, a control device may generate and change a magnetic field for tuning the qubit. The control device may comprise an electromagnet. The control qubit 3 may have a tunable frequency, such as an asymmetric transmon, and the target qubit may be a fixed-frequency transmon.

The second qubit 7 may be coupled to a readout device. The readout device may comprise a microwave generator for generating a readout pulse.

Figure 2:
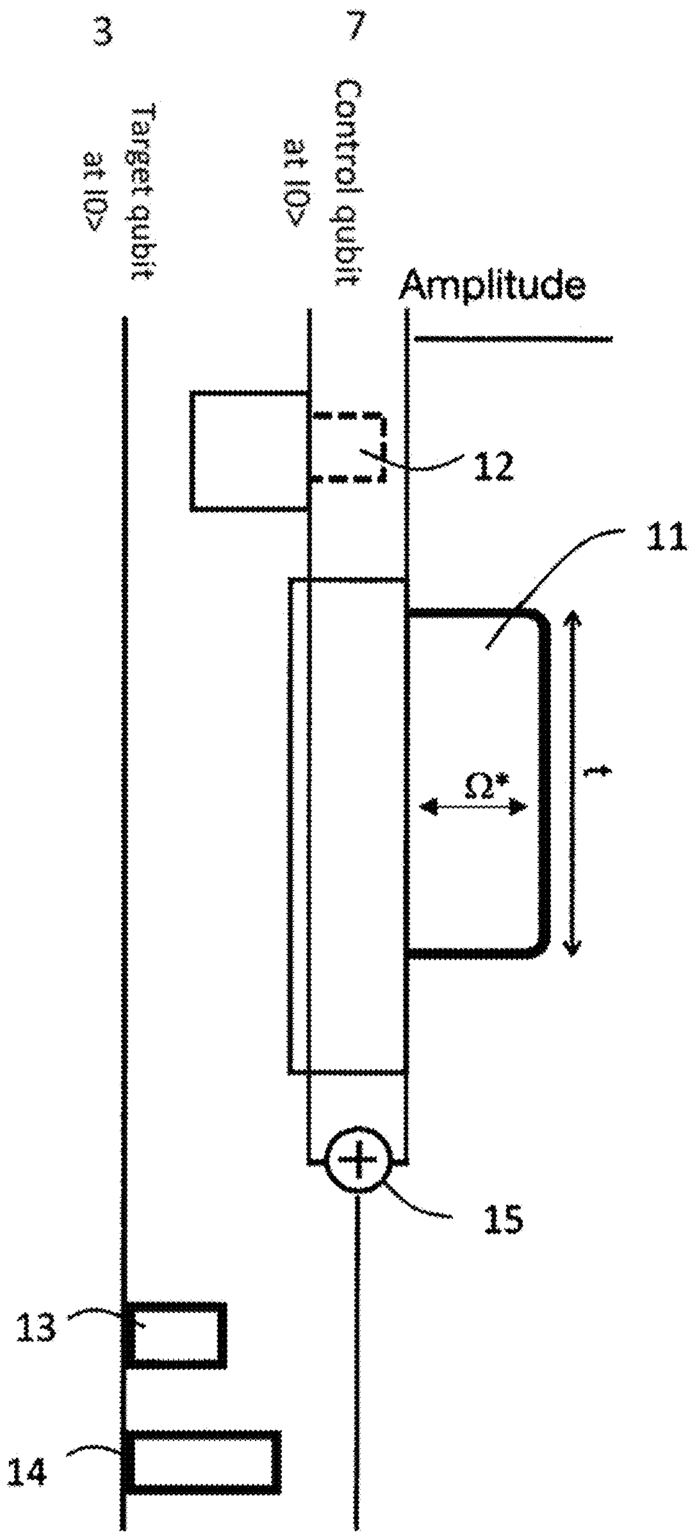
FIG. 2: Pulse sequence.

FIG. 2 schematically shows the transmission of a pulse sequence to the control qubit 7. The pulse height is plotted on the y-axis versus the time t on the x-axis. The control qubit 7 and the target qubit 3 are set to be in ground state |00>. This is referred to as "state preparation". A cross-resonance pulse 11 with a set amplitude and for the duration of time t is applied to resonator 6 via port 5 and sent from there to control qubit 7. This is referred to as the "CR drive". After the emission of the cross-resonance pulse 11, the repulsion of the qubit level should be measured. This is referred to as "target state tomography". The target-state tomography step can be found in the publication Sarah Sheldon, Easwar Magesan, Jerry M. Chow, and Jay M. Gambetta, "Procedure for systematic tuning up known cross-talk in the cross-resonance gate," PHYSICAL REVIEW A 93, 060302 (R) (2016). For the target state tomography step, we send the microwave pulse 13 to the port 1, then it travels to the target qubit 3 via the resonator 2. There are three types of microwave pulse 13. The first type of microwave pulse 13 rotates the target qubit 3 by the angle $\pi/2$ along the X-axis of the Bloch sphere. The second type of microwave pulse 13 rotates the target qubit 3 by the angle $\pi/2$ along the Y-axis of the Bloch sphere. The third type of microwave pulse 13 rotates the target qubit 3 by the angle $\pi/2$ along the Z-axis of the Bloch sphere. We apply only one of the three types of microwaves 13 to the target qubit and then measure the target qubit state in 14. After the measurement, we reinitialize the state in the state preparation step, apply an unchanged CR drive pulse with the same amplitude and time length t, then one of the three types of microwaves 13, and perform the measurement again. We repeat this with one of the three types of microwave 13 thousands of times. This determines the average probability of the target qubit state projected on the x and y and z axes. We show the mean value of the state probability along the x-axis by <x>, we show the mean value of the state probability along the y-axis by <y>, and we show the mean value of the state probability along the z-axis by <z>. The target qubit state tomography characterizes the target qubit state by three numbers <x>, <y>, <z>. After determining <x>, <y>, and <z> which are associated with the CR length t and an amplitude, we change the CR gate length t and keep the amplitude. Then we repeat the target quantum state tomography and determine the new projected target state components <x>, <y>, and <z>. In this way, we find <x>(t), <y>(t), and <z>(t) which are dependent on the CR pulse length.

We reinitialize the two qubits in the |0> state and this time we apply an X rotation gate by angle π to the control qubit each time after the initialization step. This can be done by applying the microwave pulse 12 to the control qubit. In this way, the control qubit is always initialized in the |1> state while the target qubit is in the |0> state. The process of applying CR driver step and target state tomography is repeated in a similar manner. The process of determining <x>(t), <y>(t) and <z>(t) is repeated for the case when the control qubit 7 is initialized in the |1> state.

A Hamiltonian model is used to determine the same target state projections <x>(t), <y>(t), and <z>(t) that will be control state dependent. As described in Sarah Sheldon, et. al. PHYSICAL REVIEW A 93, 060302 (R) (2016), when fitting the theoretical model to determine the experimental control-state-dependent functions <x>(t), <y>(t), and <z>(t), a ZZ interaction term must be included in the Hamiltonian model. This ZZ interaction term corresponds to the coupling strength γ of a two-qubit state phase error in the presence of a CR gate.

Repeating the quantum Hamiltonian tomography steps of FIG. 2 with a different amplitude for the CR pulse 11 will determine a different y and therefore a different two-qubit phase error. Repeating the same experiment with a specific amplitude of CR pulse 11 sets γ=0 and therefore does not yield a two-qubit state phase error.

The frequency of the two cross-resonance pulses correspond to the frequency of the target qubit 3.

Two microwave generators may be provided to generate the CR pulses. A first microwave generator generates the π-rotation along the X-axis pulses 12. A second microwave generator generates the cross-resonance pulses 11. An adder 15 may be provided to send the pulse sequence to the first qubit 7 via the microwave port 5. A third microwave generator may be provided for sending a readout pulse. A readout pulse may be sent by the third microwave generator via the second microwave port 5 to the second qubit 7 for generating one of the two types of X and Y rotations by π/2 on the target qubit 3 by the microwave pulse 13. For the rotation along the Z axis, we need two microwave generators instead of one to generate an X(π/2) and a Y(π/2). In one performance, the microwave pulse 13 is formed from two consecutive pulses, first an X rotation by π/2, followed by a Y rotation by π/2. After reinitialization, this time the pulse 13 will first perform a Y rotation by π/2, followed by an X rotation by π/2. The Z rotation by angle π/2 is the result of the difference in the results measured with the opposite orders. A fifth microwave generator may be provided for transmitting a readout pulse 15. A readout pulse may be transmitted from the third microwave generator to the qubit 3 via the second microwave link 1.

The two-qubit phase error γ due to the CR pulse depends on the CR amplitude and the frequency tuning between the control and the target qubit. The relationship is γ=g+η(Δ)Ω2, where g is the idle two-qubit error and Ω is the amplitude of the CR pulse, and η(Δ) is a function of the frequency tuning Δ=ωtarget−ωcontrol. Eliminating the two-qubit phase error using the CR pulse means that we set γ=0. This means that for a circuit with certain static error g and detuning frequency Δ, the elimination occurs at a certain amplitude Ω.

Figure 3:
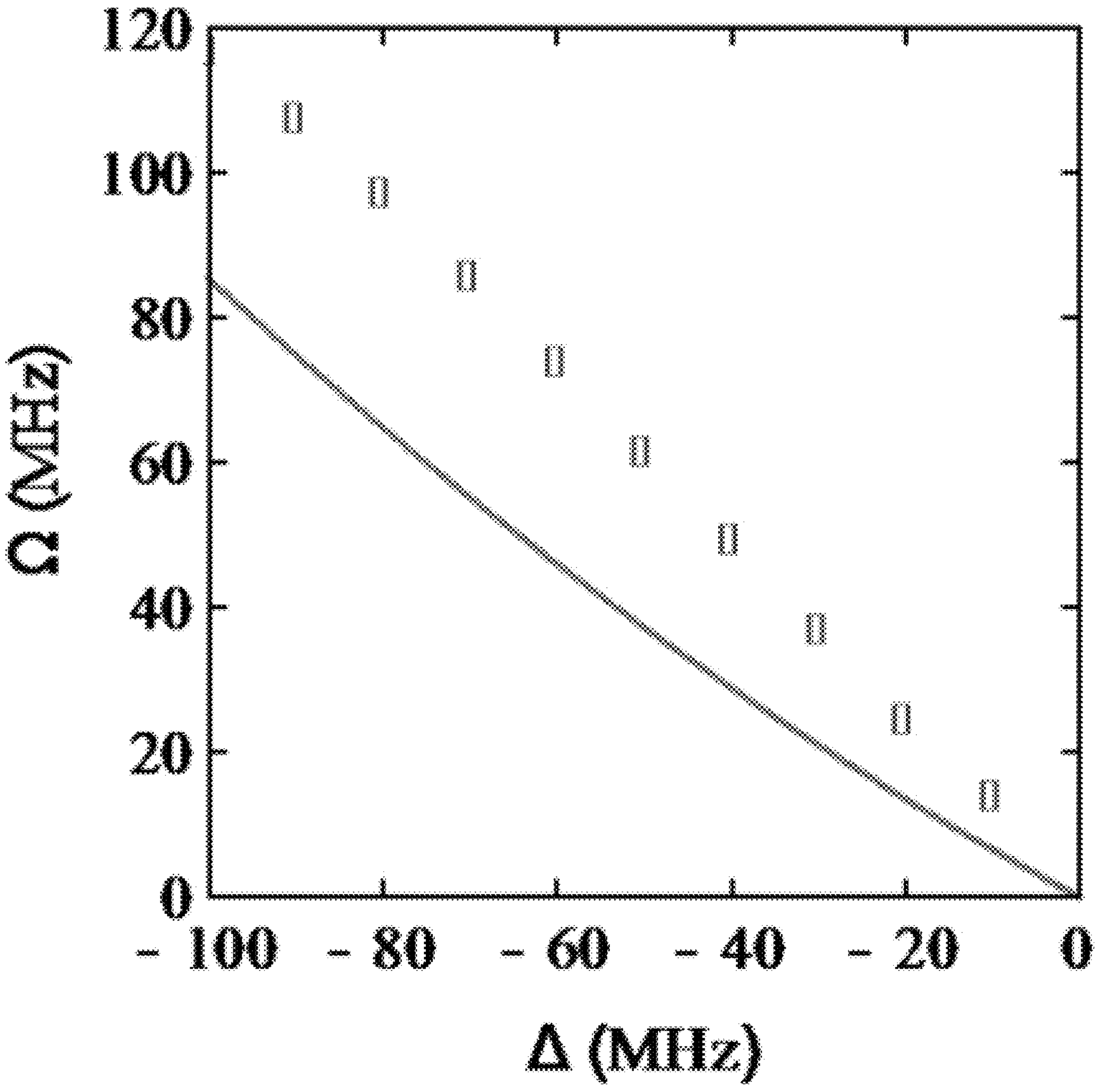
FIG. 3: Circuit QED parameters for the error-free transmon-transmon phase.

FIG. 3 refers to the theoretical results of circuit QED modeling of a circuit in which both the control and target qubit are a transmon. The control qubit 7 is driven by a CR pulse 11 with amplitude Ω. The frequency of the control qubit is ωc and the frequency of the target qubit is ωt. For the control and target qubit that have the same value of anharmonicity, the control qubit has a larger frequency. The difference between the frequency of the target qubit and the frequency of the control qubit is the frequency of the transmon-transmon detuning. The detuning frequency Δ can be negative. We show the detuning frequency on the x-axis of FIG. 3 and the amplitude of the CR pulse on the y-axis. Rectangles and solid line show the estimated values of CR pulse amplitude in which the repulsion level between E11 and non-computation states is set to zero for an arbitrary detuning frequency Δ. The solid line are the solutions taken from perturbation theory. The rectangles show the results of the exact solution.

Figure 4:
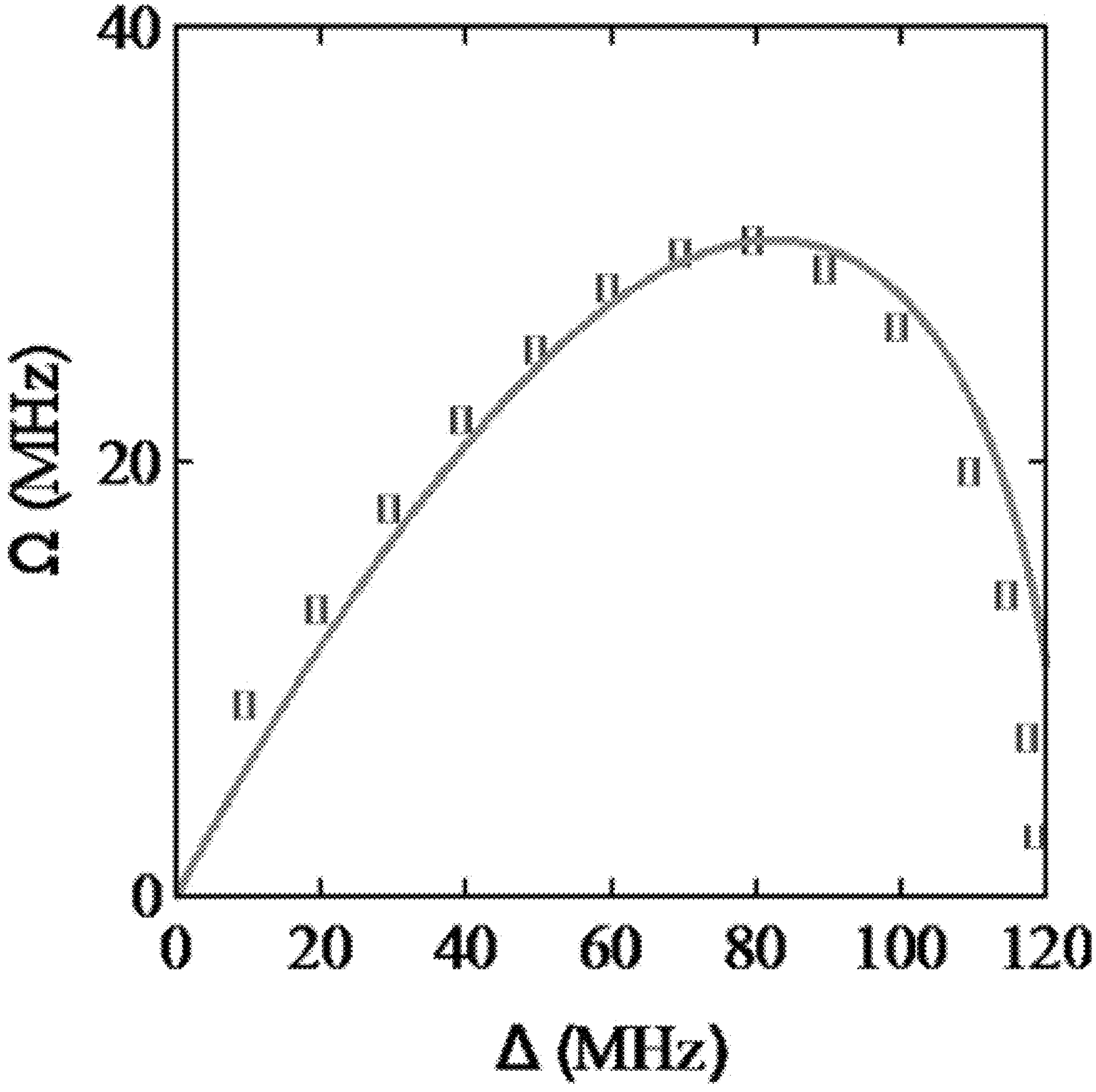
FIG. 4: Circuit QED parameters for the error-free transmon-transmon phase.

FIG. 4 refers to the theoretical results of circuit QED modeling of a circuit where the control qubit is a CSFQ and the target qubit is a transmon. The control qubit 7 is driven by a CR pulse 11 with amplitude Ω. The frequency of the control qubit is ωc and the frequency of the target qubit is ωt. In the control qubit, the anharmonicity is positive and in the target qubit, the anharmonicity is negative. The anharmonicity of the control qubit can be larger than the absolute value of the anharmonicity in the target qubit. In this case, the frequency of the control qubit is smaller than the frequency of the target qubit. The difference between the frequency of the target qubit and the frequency of the control qubit is the CSFQ transmon detuning frequency. The detuning frequency Δ can be positive. We show the detuning frequency on the x-axis of FIG. 4 and the amplitude of the CR pulse on the y-axis. Rectangles and solid line show the estimated amplitude of the CR pulse at which the repulsion of the qubit level vanishes for each detuning frequency Δ. The solid line shows the result from perturbation theory. The rectangles show that the results are not perturbative and give more precise results.

In order to experimentally determine whether the state dephasing due to level repulsion is zero or at least close to zero, Hamiltonian tomography is required to make the determination. Hamiltonian tomography can be found in Sarah Sheldon, Easwar Magesan, Jerry M. Chow, and Jay M. Gambetta, "Procedure for systematic tuning up cross-talk in the cross-resonance gate," PHYSICAL REVIEW A 93, 060302 (R) (2016). Known methods can thus be used. A cross-resonance drive is applied for some time and the Rabi oscillations are measured on the target qubit. We project the state of the target qubit to x, y and z after the Rabi drive and repeat this for the control qubit in $|0\rangle$ and $|1\rangle$. In this way, we find the exact interaction strengths of each of the above terms in the CR Hamiltonian. This is called a CR tomography experiment.

In the first step, the two qubits are initialized in the |00> state. A CR pulse is sent to the control qubit 7.

The dephasing of the state from the repulsion plane is then measured by CR tomography. If the value is non-zero, the amplitude of the cross-resonance pulse is changed and the process is repeated. If the value is zero, the optimum amplitude sought has been found.

The results shown in FIG. 5 were found for 10 different cases. The first five cases show results for the previously described case where the first qubit is a CSFQ and the second qubit is a transmon. The subsequent five cases, as described previously, relate to a circuit where the first qubit and the second qubit are a transmon. In all cases, an entanglement of the two qubits succeeded. The table shows that it is not always possible to find a value of zero. In these cases, the amplitude closest to zero is selected.

FIG. 6 shows the result of applying two qubit gates CNOT to two pairs of qubits. The gate CNOT acts on the qubits for the duration of time t. In the first pair, the two-qubit phase error is present. The phase error is proportional to $\pm\gamma t$. The sign depends on the state of the two qubits. The sign is positive if the two qubits have the same states. The sign is negative if the states of the qubits are different. In the second pair, we eliminate the fundamental two-qubit phase error by coordinating the qubit parameters and the amplitude of a microwave pulse.

FIG. 7 shows the value of the two-qubit phase error $\gamma$ as a function of the CR pulse amplitude in two different transmon-transmon circuits 16 and 17. In circuit 16, the phase error initially decreases by increasing the amplitude, but starts to increase after reaching a positive minimum without zero crossing. Therefore, it is impossible to make circuit 16 free of two-qubit phase errors. In circuit 17, the phase error decreases by increasing the amplitude of the CR pulse and crosses zero and changes sign. The point where the zero crossing occurs is the specific amplitude that eliminates the qubit-two-qubit phase error.

The foregoing invention has been described in accordance with the relevant legal standards, thus the description is exemplary rather than limiting in nature. Variations and modifications to the disclosed embodiment may become apparent to those skilled in the art and fall within the scope of the invention.

The invention claimed is:

1. Method of operating a circuit with a first qubit (7) and a second qubit (3), wherein the circuit is configured such that the frequency of the first qubit (7) is different from the frequency of the second qubit (3), with a coupler (4) coupling the first qubit (7) and the second qubit (3), wherein a cross-resonance pulse is sent to the first qubit (7), wherein the amplitude of the cross-resonance pulse is selected to reduce the two-qubit phase error, wherein a two-qubit phase error is made by repulsion between qubit energy levels and non-calculation levels, and wherein the first qubit (7) is a transmon and the second qubit (3) is a transmon, and the frequency of the first qubit (7) is greater than the frequency of the second qubit (3).

2. Method according to claim 1, characterized in that the amplitude of the cross-resonance pulse is selected such that the two-qubit phase error is set to zero.

3. Method according to claim 1, characterized in that a control device for one of the first and second qubits is present, by means of which the frequency of the one first or second qubit can be tuned.

4. Method according to claim 3, characterized in that the control device can generate and change a magnetic field.

5. Method according to claim 4, characterized in that the control device comprises an electromagnet.

6. Method according to claim 1, characterized in that the frequency of the cross-resonance pulse corresponds to the frequency of the second qubit (3).

7. Method according to claim 1, characterized in that the second qubit (3) is coupled to a readout device.

* * * * *